US011908986B2

(12) United States Patent
Ge

(10) Patent No.: US 11,908,986 B2
(45) Date of Patent: Feb. 20, 2024

(54) DISPLAY PANEL AND MANUFACTURING METHOD THEREOF AND DISPLAY DEVICE

(71) Applicant: Hubei Yangtze Industrial Innovation Center Of Advanced Display Co., Ltd., Wuhan (CN)

(72) Inventor: Shucheng Ge, Wuhan (CN)

(73) Assignee: Hubei Yangtze Industrial Innovation Center Of Advanced Display Co., Ltd., Wuhan (CN)

( * ) Notice: Subject to any disclaimer, the term of this patent is extended or adjusted under 35 U.S.C. 154(b) by 373 days.

(21) Appl. No.: 17/234,799

(22) Filed: Apr. 20, 2021

(65) Prior Publication Data
US 2021/0242383 A1 Aug. 5, 2021

(30) Foreign Application Priority Data

Dec. 30, 2020 (CN) .......................... 202011615859.5

(51) Int. Cl.
*H01L 33/62* (2010.01)
*H01L 25/075* (2006.01)
(52) U.S. Cl.
CPC .......... *H01L 33/62* (2013.01); *H01L 25/0753* (2013.01); *H01L 2933/0066* (2013.01)
(58) Field of Classification Search
CPC .................. H01L 33/62; H01L 25/0753; H01L 2933/0066; H01L 25/167; H01L 33/48; H01L 27/156; H01L 2933/0033
See application file for complete search history.

(56) References Cited

U.S. PATENT DOCUMENTS

| 6,265,783 B1 * | 7/2001 | Juso .................. H01L 23/49838 |
| | | 257/E23.07 |
| 10,658,349 B1 * | 5/2020 | Goward ............ H01L 27/14605 |
| 10,892,214 B2 * | 1/2021 | Bonart .................. H01L 23/544 |
| 2018/0002161 A1 * | 1/2018 | Jenkins ................ B81B 3/0078 |
| 2019/0088547 A1 * | 3/2019 | Chiu ...................... H01L 23/3135 |
| 2019/0361551 A1 * | 11/2019 | Lius ...................... G06F 3/0412 |
| 2020/0235084 A1 * | 7/2020 | Wu ........................ H01L 33/46 |
| 2021/0035890 A1 * | 2/2021 | Yu .......................... H01L 21/486 |
| 2021/0035935 A1 * | 2/2021 | Chen ...................... H01L 24/08 |
| 2021/0119079 A1 * | 4/2021 | Hwang .................. H01L 33/38 |
| 2022/0059510 A1 * | 2/2022 | Su .......................... H01L 24/26 |

FOREIGN PATENT DOCUMENTS

CN 210982989 U 7/2020

* cited by examiner

*Primary Examiner* — Victor A Mandala
(74) *Attorney, Agent, or Firm* — KILPATRICK TOWNSEND & STOCKTON LLP

(57) ABSTRACT

Disclosed are a display panel and a display device. The display panel includes a base substrate. The base substrate is provided with bonding electrodes, Micro-LEDs are disposed on a side of the plurality of bonding electrodes facing away from the base substrate; and the plurality of Micro-LEDs are electrically connected to bonding electrodes in one-to-one correspondence. On a plane parallel to a plane where the base substrate is located, along a direction from a center of the base substrate to an edge of the base substrate, a size of each bonding electrode of the plurality of bonding electrodes gradually increases and/or a distance between centers of adjacent two of the plurality of bonding electrodes gradually increases to enable each Micro-LED of the plurality of Micro-LEDs to be bonded with a corresponding bonding electrode.

20 Claims, 10 Drawing Sheets

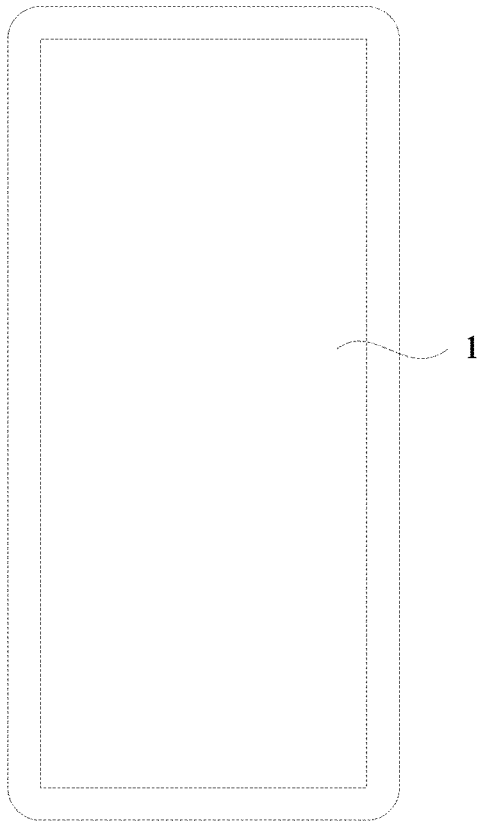

FIG. 15

| Obtain a base substrate, where multiple bonding electrodes are disposed on the base substrate; and on a plane parallel to a plane where the base substrate is located and along a direction from a center of the base substrate to an edge of the base substrate, a size of each bonding electrode gradually increases, or a distance between centers of adjacent two bonding electrodes gradually increases | ⌒S110 |

↓

| Obtain multiple Micro-LEDs disposed in an array on a transfer substrate, where the Micro-LEDs and the transfer substrate are attached through a transfer material; the transfer material is a thermal expandable material; the Micro-LEDs form a chip array on the transfer substrate; each Micro-LED has a same size; and distances between adjacent Micro-LEDs are the same | ⌒S120 |

FIG. 16

```
┌─────────────────────────────────────────────────────────────┐
│  Define a standard array structure including multiple standard bonding │
│  positions on the plane where the base substrate is located; where the multiple │
│  standard bonding positions and the multiple Micro-LEDs of the chip array are │
│  in one-to-one correspondence and the multiple standard bonding positions │──S210
│  have a same size; and a distance between centers of adjacent two standard │
│  bonding positions is the same as a distance between adjacent Micro-LEDs │
└─────────────────────────────────────────────────────────────┘
                              │
                              ▼
┌─────────────────────────────────────────────────────────────┐
│  Simulate and Stretch the standard array structure according to an expansion │
│  coefficient of the transfer material to obtain a target array structure; where in │
│  the target array structure, along the direction from the center of the base │──S220
│  substrate to the edge of the base substrate, a distance between centers of │
│  adjacent two bonding positions gradually increases │
└─────────────────────────────────────────────────────────────┘
                              │
                              ▼
┌─────────────────────────────────────────────────────────────┐
│  Dispose one-to-one corresponding bonding electrodes on the base substrate │──S230
│  according to the multiple bonding positions in the target array structure │
└─────────────────────────────────────────────────────────────┘
                              │
                              ▼
┌─────────────────────────────────────────────────────────────┐
│  Obtain multiple Micro-LEDs disposed in an array on a transfer substrate │──S240
└─────────────────────────────────────────────────────────────┘
                              │
                              ▼
┌─────────────────────────────────────────────────────────────┐
│  Bond each Micro-LED with a corresponding bonding electrode, so that after │
│  offsetting due to the transfer material, the Micro-LED is capable of being │──S250
│  bonded with the corresponding bonding electrode │
└─────────────────────────────────────────────────────────────┘
```

FIG. 17

DISPLAY PANEL AND MANUFACTURING METHOD THEREOF AND DISPLAY DEVICE

CROSS-REFERENCE TO RELATED APPLICATION

This application claims priority to Chinese Patent Application No. 202011615859.5 filed Dec. 30, 2020, the disclosure of which is incorporated herein by reference in its entirety.

FIELD

The present disclosure relates to the field of display and, in particular, to a display panel and a manufacturing method thereof and a display device.

BACKGROUND

The micro light emitting display (Micro-LED) refers to the miniaturization of the traditional LED structure. The size of a single Micro-LED chip is generally less than 50 microns, and the Micro-LED chip is combined with the pixel drive circuit to achieve the display technology of addressing control and individual driving of each pixel. The Micro-LED retains the advantages of traditional LED materials and devices, such as high brightness, high light efficiency, long life, high contrast, and nanosecond response time. At the same time, the Micro-LED is manufactured by using the semiconductor processing technology and is compatible with IC technology. The processing precision and stability of the Micro-LED are extremely high, so that the ultra-high resolution can be achieved, and the Micro-LED is easy to be integrated with a tactile sensor, an audible sensor, an olfactory sensor and so on to achieve high precision spatial location and tactile perception. The Micro-LED display is considered the most promising next-generation display technology, but many difficulties in core technologies still exit. For example, the mass transfer technology needs to be achieved.

At present, some mass transfer technologies have been developed, such as the STAMP transfer bonding mode. A key material of Polydimethylsiloxane (PDMS) is needed for STAMP transfer bonding. PDMS is resistant to the high temperature of 150° C., while the Au—In eutectic process for bonding Micro-LED and a substrate needs the temperature of 170° C. Therefore, during the bonding process of Micro-LED, PDMS is expanded after heated for a long time, and thus a bonding offset is caused between Micro-LED and the substrate due to the increase of the expansion amount.

SUMMARY

Embodiments of the present disclosure provide a display panel and a manufacturing method thereof and a display device.

In one embodiment of the present disclosure provides a display panel. The display panel includes a base substrate.

The base substrate is provided with bonding electrodes; Micro-LEDs are disposed on a side of the plurality of bonding electrodes facing away from the base substrate; and the plurality of Micro-LEDs are electrically connected to the plurality of bonding electrodes in one-to-one correspondence.

On a plane parallel to a plane where the base substrate is located, along a direction from a center of the base substrate to an edge of the base substrate, a size of each bonding electrode of plurality of bonding electrodes gradually increases and/or a distance between centers of adjacent two of the plurality of bonding electrodes gradually increases to enable each Micro-LED of the plurality of Micro-LEDs to be bonded with a corresponding bonding.

In one an embodiment of the present disclosure provides a display device. The display device includes the display panel provided by any one of the embodiments of the present disclosure.

In one embodiment of the present disclosure further provides a manufacturing method of a display panel. The method includes the steps described below.

A base substrate is obtained, where bonding electrodes are disposed on the base substrate; and on a plane parallel to a plane where the base substrate is located and along a direction from a center of the base substrate to an edge of the base substrate, a size of each of the plurality of bonding electrodes gradually increases, or a distance between centers of adjacent two of the plurality of bonding electrodes gradually increases.

Micro-LEDs disposed in an array on a transfer substrate is obtained, where the plurality of Micro-LEDs and the transfer substrate are attached through a transfer material; the transfer material is a thermal expandable material; the plurality of Micro-LEDs form a chip array on the transfer substrate; each of the plurality of Micro-LED has a same size; and distances between adjacent Micro-LEDs are the same.

Each Micro-LED of the plurality of Micro-LEDs is bonded with a corresponding bonding electrode, so that after offsetting due to the transfer material, the each Micro-LED is being bonded with the corresponding bonding electrode.

BRIEF DESCRIPTION OF DRAWINGS

FIG. 15 is a structural view of a display device according to an embodiment of the present disclosure;

FIG. 16 is a flowchart of a manufacturing method of a display panel according to an embodiment of the present disclosure; and FIG. 17 is a flowchart of another manufacturing method of a display panel according to an embodiment of the present disclosure.

DETAILED DESCRIPTION

Figure 1:
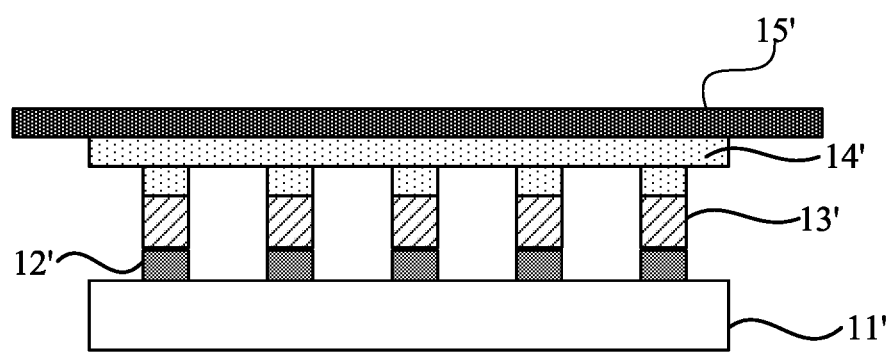
FIG. 1 is a structural view showing a structure before Micro-LEDs bonding with bonding electrodes in the related art.

The present disclosure is further described below in detail in conjunction with the drawings and embodiments. It is to be understood that the embodiments described herein are merely intended to explain the present disclosure and are not intended to limit the present disclosure. Additionally, it should be noted that for ease of description, only the part, instead of all, related to the present disclosure is illustrated in the drawings.

Figure 2:
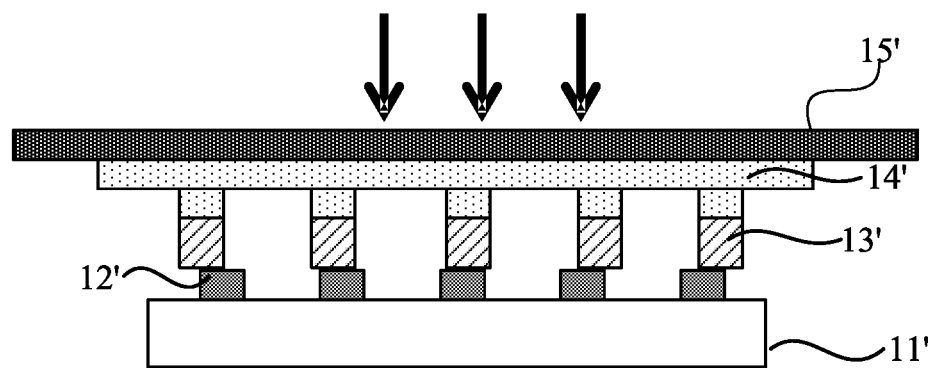
FIG. 2 is a structural view showing a structure after Micro-LEDs bonding with bonding electrodes in the related art.

As mentioned in the Background, a key material of Polydimethylsiloxane (PDMS) is needed for STAMP transfer bonding. PDMS is resistant to the high temperature of 150° C., while the Au—In eutectic process for bonding Micro-LEDs and a substrate needs the temperature of 170° C. which is greater than the tolerable temperature of PDMS, and thus a bonding offset is caused between the Micro-LEDs and the substrate due to the thermal expansion of PDMS. As shown in FIG. 1, FIG. 1 is a structural view showing a structure before Micro-LEDs bonding with bonding electrodes in the related art. Before a STAMP substrate 15' drives Micro-LEDs 13' to be laminated with a base substrate 11', that is, before the eutectic process, positions of bonding electrodes 12' on the base substrate 11' are in one-to-one correspondence to positions of the Micro-LEDs 13' on the base substrate 11', and the bonding electrodes 12' may completely coincide with the positions of the Micro-LEDs 13' before being laminated. However, when the STAMP substrate 15' is laminated with the base substrate 11' to perform the eutectic process, the PDMSs 14' are thermally expanded (referring to FIG. 2, FIG. 2 is a structural view showing a structure after Micro-LEDs bonding with bonding electrodes in the related art), thus the Micro-LEDs 13' partially offset due to the thermal expansion of the PDMS 14', resulting in small or even no overlapping areas of the bonding surfaces between the Micro-LEDs 13' and the bonding electrodes 12', which affects the bonding between the Micro-LEDs 13' and the bonding electrodes 12' and leads to defects in the process. In the process of implementing the schemes of the present disclosure, it is found that the PDMSs expand linearly and uniformly, so that the offset positions of the Micro-LEDs 13' are regular. Therefore, the offset positions of the Micro-LEDs 13' can be estimated.

To solve the above problem, the positions of the bonding electrodes may be pre-adjusted according to the offset positions of the Micro-LEDs. In one embodiment, an embodiment of the present disclosure provides a display panel. The display panel includes a base substrate.

The base substrate is provided with multiple bonding electrodes; multiple Micro-LEDs are disposed on a side of the multiple bonding electrodes facing away from the base substrate; and the Micro-LEDs are electrically connected to the bonding electrodes in one-to-one correspondence.

On a plane parallel to a plane where the base substrate is located, along a direction from a center of the base substrate to an edge of the base substrate, a size of each bonding electrode gradually increases and/or a distance between centers of adjacent two bonding electrodes gradually increases to enable each Micro-LED to be bonded with a corresponding bonding electrode.

In the embodiment of the present disclosure, the base substrate of the display panel is provided with multiple bonding electrodes. On the plane where the base substrate is located, along the direction from the center of the base substrate to the edge of the base substrate, the size of each bonding electrode gradually increases, or along the direction from the center of the base substrate to the edge of the base substrate, the distance between centers of adjacent two bonding electrodes gradually increases, or along the direction from the center of the base substrate to the edge of the base substrate, the size of each bonding electrode gradually increases and the distance between centers of adjacent two bonding electrodes gradually increases. Multiple Micro-LEDs are disposed on the side of the multiple bonding electrodes facing away from the base substrate. The Micro-LEDs are bonded with corresponding bonding electrodes through a transfer substrate coated with a transfer material, so that after offsetting due to the transfer material, positions of the Micro-LEDs can be bonded with the corresponding bonding electrodes. In the embodiment, the trend of the offset of the Micro-LEDs due to the transfer material is predicted, the positions of the bonding electrodes are disposed at the offset positions of the Micro-LEDs or the sizes of the Micro-LEDs are enlarged, so that the Micro-LEDs can be bonded with the corresponding bonding electrodes.

Hereinafter, schemes in the embodiments of the present disclosure will be described clearly and completely in conjunction with the drawings in the embodiments of the present disclosure.

Figure 3:
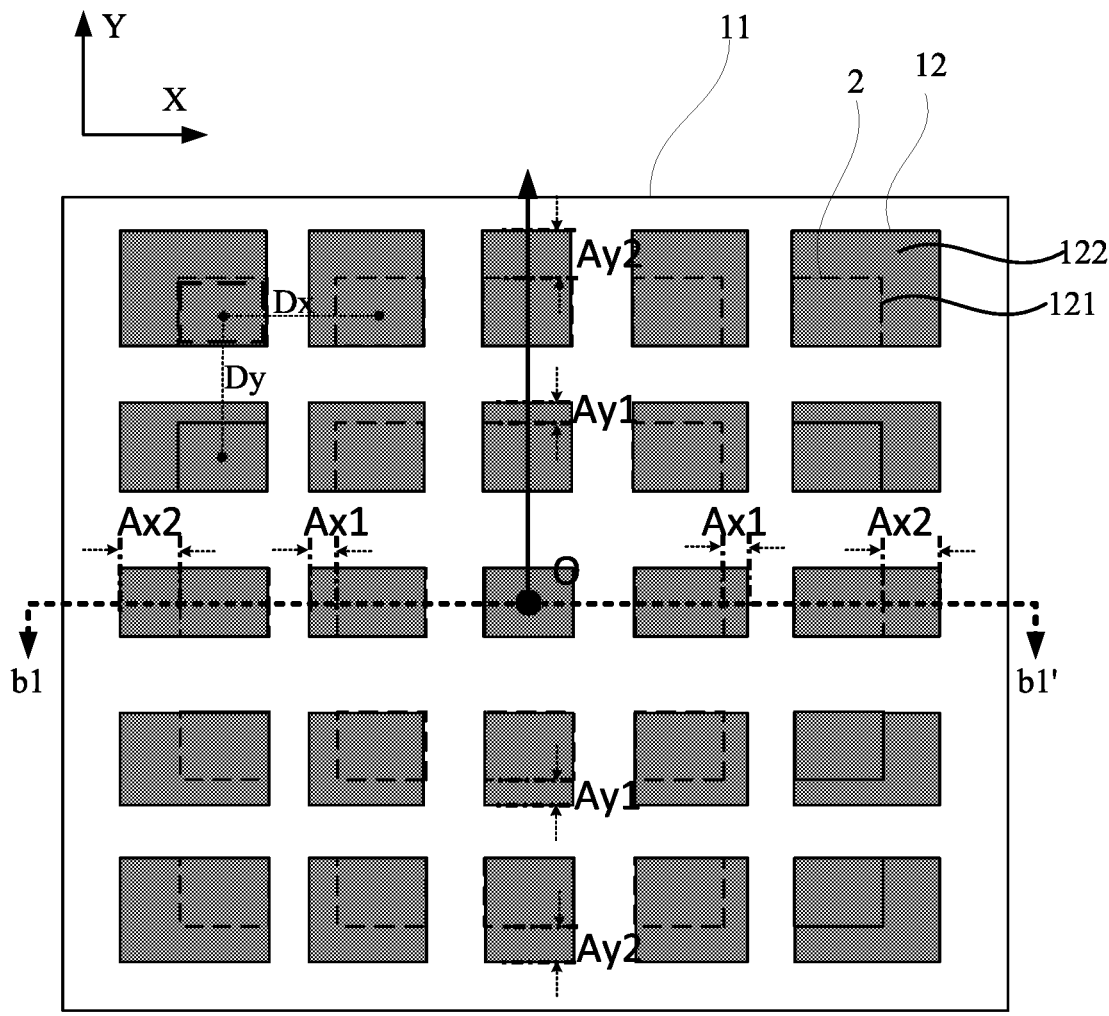
FIG. 3 is a plan structural view of a display panel according to an embodiment of the present disclosure.
Figure 4:
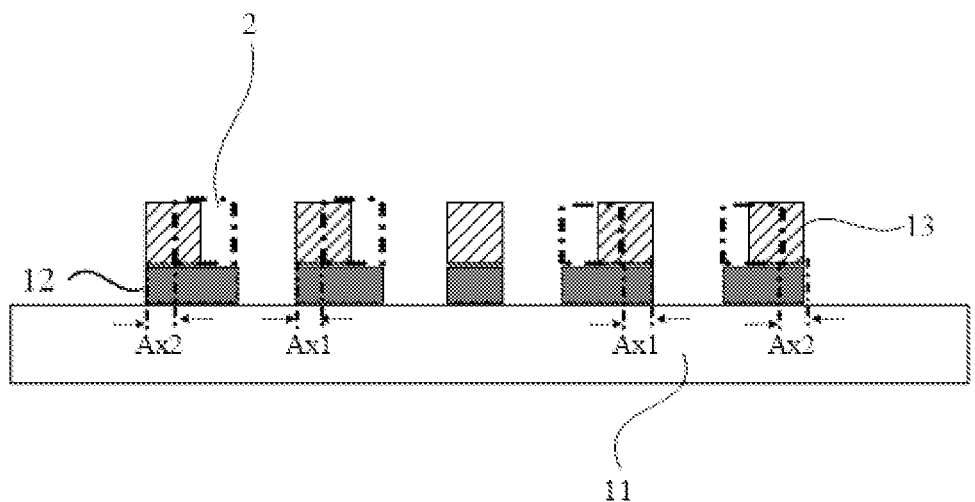
FIG. 4 is a sectional structural view of the display panel in FIG. 3 taken along a segment b1-b1'.

FIG. 3 is a plan structural view of a display panel according to an embodiment of the present disclosure. FIG. 4 is a sectional structural view of the display panel in FIG. 3 taken along a segment b1-b1'. The base substrate 11 may be provided with multiple bonding electrodes 12, as shown in FIG. 3, the bonding electrodes 12 may be arranged in a regular array or an irregular array, and the array shape of the bonding electrodes 12 is not limited in the embodiment. In an embodiment, the base substrate 11 is further provided with pixel drive circuits (not shown in FIG. 3) arranged in an array, and the pixel drive circuits are electrically connected to the bonding electrodes 12 in one-to-one correspondence for supplying supply voltages to the corresponding bonding electrodes 12. It should be noted that, for the sake of clarity, only the base substrate 11 and the bonding electrodes 12 are shown in FIG. 3, and actually other structures are included. As shown in FIG. 4, multiple Micro-LEDs 13 are further disposed on the side of the bonding electrodes 12 facing away from the base substrate 11, and the Micro-LEDs 13 are disposed in one-to-one correspondence to the bonding electrodes 12 so that the Micro-LEDs 13 emit light.

Figure 5:
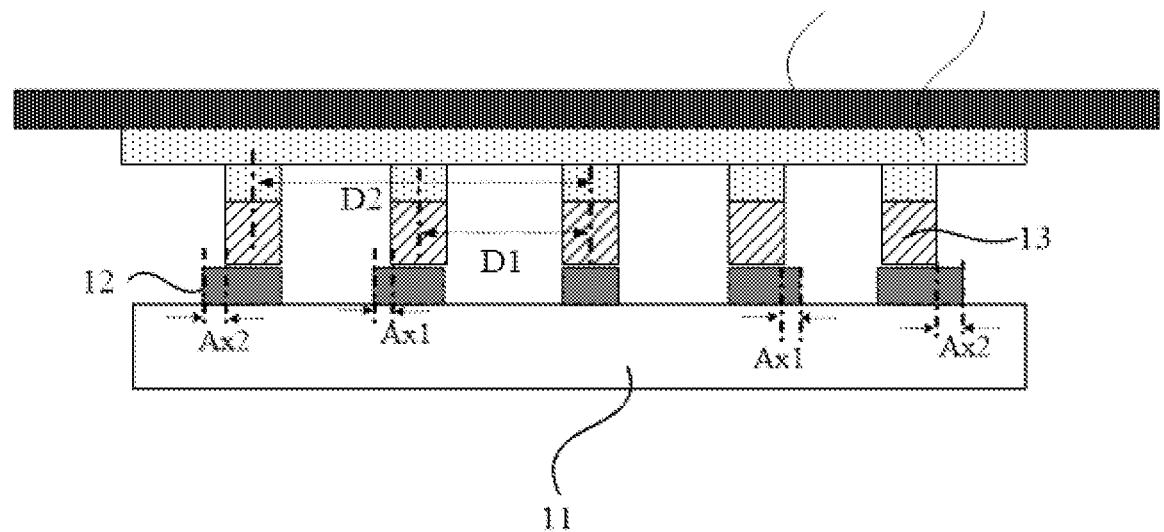
FIG. 5 is a schematic view showing a structure before Micro LEDs bonding with bonding electrodes according to an embodiment of the present disclosure.

FIG. 5 is a schematic view showing a structure before Micro LEDs bonding with bonding electrodes according to an embodiment of the present disclosure. The structure of the display panel in FIG. 5 after the eutectic bonding process is completed is shown in FIG. 4. Before the Micro-LEDs 13 are bonded with the bonding electrodes, the bonding electrodes 12 are transferred from the process platform in batches by a transfer substrate 15, the bonding electrodes 12 are attached to the transfer substrate 15 through a transfer material 14, and then the positions of the Micro-LEDs 13 and the bonding electrodes 12 are shown in FIG. 4 after the Micro-LEDs 13 are bonded with the bonding electrodes 12.

Standard bonding positions 2 are defined in FIG. 4. The standard bonding positions 2 are the initial positions of the Micro-LEDs 13 on the plane where the base substrate 11 is located. In this embodiment, the initial positions of the Micro-LEDs 13 are arranged in a regular array. After the linear expansion due to the transfer material 14 occurs, the final positions of the Micro-LEDs 13 are shown in FIG. 4.

Figure 6:
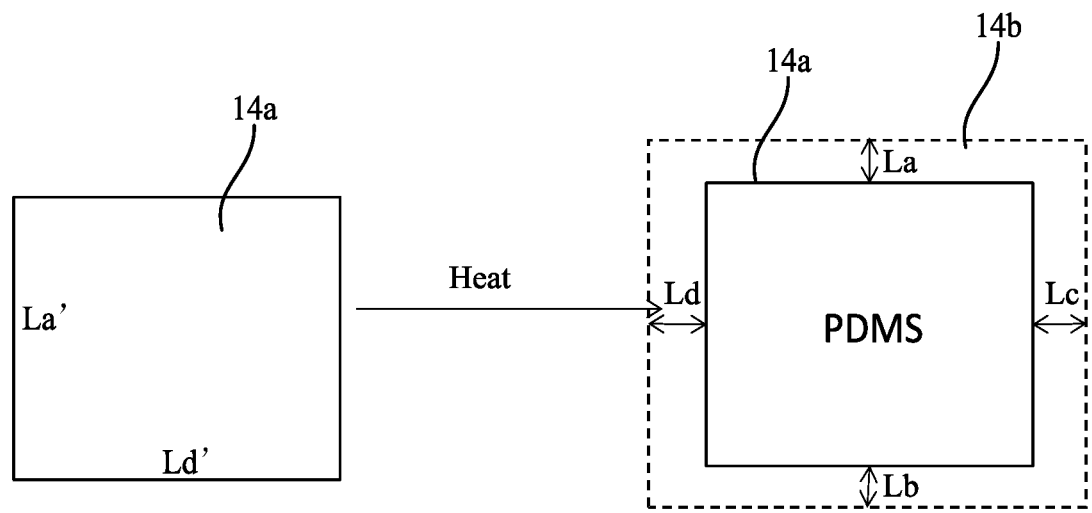
FIG. 6 is a plan view showing a structure of a transfer material, provided by the present disclosure, before linear expansion and a structure of the transfer material after the linear expansion.

FIG. 6 is a plan view showing a structure of a transfer material, provided by the present disclosure, before linear expansion and a structure of the transfer material after the linear expansion. The size of the transfer material 14 before the thermal expansion is a region 14*a*. For example, the transfer material 14 may be a rectangle. The length of a first side of the rectangle is La', and the length of a second side is Ld'. After the transfer material 14 is heated by a temperature higher than the tolerable temperature, the size of the transfer material 14 after the thermal expansion is shown as a region 14*b*. As shown in FIG. 6, during the expansion process, the transfer material 14 expands linearly and uniformly from the center of the material to the periphery. For example, four sides of the transfer material 14 expand, and each side expands outward by widths of La, Lb, Lc, and Ld. In the embodiment, La/La'=Lb/La', Lc/Ld'=Ld/Ld', so that the direction and distance of the offset of the Micro-LEDs 13 arranged in a regular array can be estimated and predicted. Therefore, the positions and sizes of the bonding electrodes 12 are set according to the direction and distance of the offset, and the Micro-LEDs 13 which offset due to the bonding process can be bonded with the corresponding bonding electrodes 12. It should be noted that the sizes mentioned in the embodiment on the plane where the base substrate 11 is located include the shape and dimension of the target object on the plane where the base substrate 11 is located. For example, if the sizes of two target objects on the plane where the base substrate 11 is located are the same, vertical projections of the two target objects on the plane where the base substrate 11 is located completely coincide with each other. On the plane where the base substrate 11 is located, the size of the target object along one direction mentioned in the embodiment is the width of the target object along the another direction on the plane where the base substrate 11 is located.

With continued reference to FIG. 3, on the plane where the base substrate 11 is located, along a direction from a center O of the base substrate 11 to an edge of the base substrate 11, the size of the bonding electrode 12 (for example, Ax1, Ax2, Ay1, Ay2 and so on) may gradually increase. Even if the positions of the Micro-LEDs 13 offset after the eutectic process, the Micro-LEDs 13 can be bonded with the corresponding bonding electrodes 12. The center O of the base substrate 11 mentioned in the embodiment is the central position of the geometry of the base substrate 11 on the plane where the base substrate 11 is located, is the intersection of symmetry axes of the base substrate 11 on the plane where the base substrate 11 is located, and is the geometric center of the base substrate 11.

Figure 7:
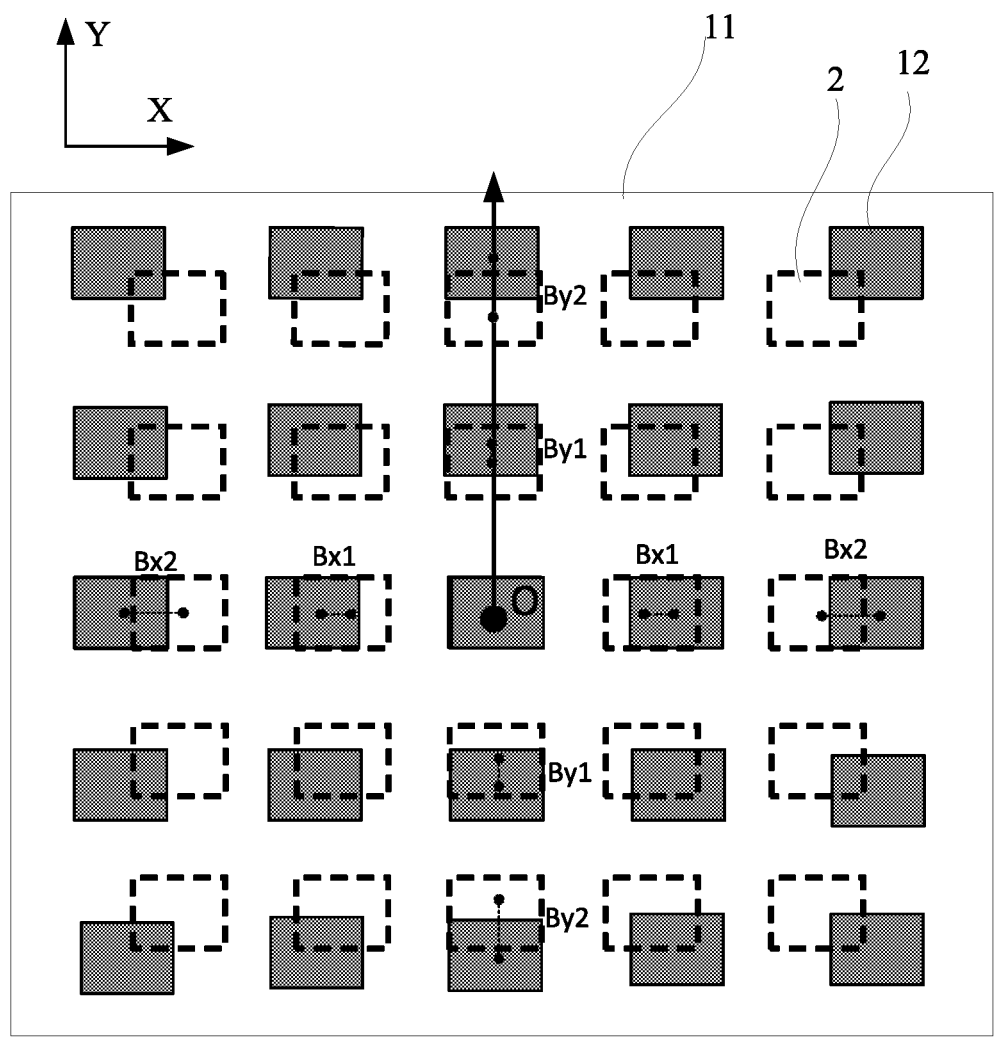
FIG. 7 is a plan structural view of another display panel according to an embodiment of the present disclosure.

In one embodiment, as shown in FIG. 7, FIG. 7 is a plan structural view of another display panel according to an embodiment of the present disclosure. Along the direction from the center O of the base substrate 11 to the edge of the base substrate 11, a distance between centers of adjacent two bonding electrodes 12 (for example, Bx1, Bx2, By1, By2 and so on) may gradually increase, so that the positions of the offsetting Micro-LEDs 13 are matched, and the Micro-LEDs 13 are bonded with the corresponding bonding electrodes.

In one embodiment, referring to FIG. 3 and FIG. 7, along the direction from the center O of the base substrate 11 to the edge of the base substrate 11, the distance between centers of adjacent two bonding electrodes 12 may gradually increase, so that the positions of the offsetting Micro-LEDs 13 are matched, and the Micro-LEDs 13 are bonded with the corresponding bonding electrodes 12. Moreover, in order to further increase bonding areas between the Micro-LEDs 13 and the corresponding bonding electrodes 12, and to avoid the errors generated by the calculation in the above manner of increasing the distance between centers of two adjacent bonding electrodes 12, the size of the bonding electrode 12 may also sequentially increase along the direction from the center O of the base substrate 11 to the edge of the base substrate 11. According to the setting manner of the bonding electrodes 12 provided in the embodiment, the reliability of bonding between the Micro-LEDs 13 and the corresponding bonding electrodes 12 is further enhanced.

According to the above three setting manners of the bonding electrodes 12, the positions of the bonding electrodes are disposed at the offset positions of the Micro-LEDs or the sizes of the Micro-LEDs are enlarged, so that the Micro-LEDs can be bonded with the corresponding bonding electrodes.

With continued reference to FIG. 3, in an embodiment, along the direction from the center O of the base substrate 11 to the edge of the base substrate 11, the size of each bonding electrode 12 may gradually increase. Multiple bonding electrodes 12 are disposed in rows along a first direction X and in columns along a second direction Y to form a matrix structure; and the first direction X intersects the second direction Y. Along the first direction X from the center O of the base substrate 11 to the edge of the base substrate 11, the size of each bonding electrode 12 gradually increases along the first direction X; and along the second direction Y from the center O of the base substrate 11 to the edge of the base substrate 11, the size of each bonding electrode 12 gradually increases along the second direction Y.

In the embodiment, the bonding electrodes may be arranged in a matrix structure. In one embodiment, the bonding electrodes 12 are disposed in rows along the first direction X and in columns along the second direction Y. The first direction X and the second direction Y are two directions that intersect each other on the plane where the base substrate 11 is located, which is conductive to increasing the sizes along the first direction X and the second direction Y. In one embodiment, along the first direction X from the center O of the base substrate 11 to the edge of the base substrate 11, the sizes of the bonding electrodes 12 may be sequentially set as Ay1, Ay2, Ay3 and so on, and Ay1, Ay2, Ay3 and so on gradually increase. Similarly, along the second direction Y from the center O of the base substrate 11 to the edge of the base substrate 11, the sizes of the bonding electrodes 12 may be sequentially set as Ax1, Ax2, Ax3 and so on, and Ax1, Ax2, Ax3 and so on gradually increase. In this embodiment, the bonding electrodes 12 are designed as a matrix, which is conductive to splitting the sizes along the first direction X and the second direction Y and respectively calculating the part of the sizes of the bonding electrodes 12 to be increased along the two directions. Therefore, it is convenient to quickly and accurately obtain the sizes of the bonding electrodes 12 with increased part, so that the design and production efficiency of the bonding electrodes 12 is improved. In an embodiment, the first direction X and the second direction Y may be perpendicular to each other, which is convenient to superimpose and set the sizes of the bonding electrodes 12 along the first direction Y and the second direction Y, and reduce the difficulty of setting the sizes of the bonding electrodes 12. Exemplarily, when the sizes of the bonding electrodes 12 are obtained along the first direction X and the second direction Y, each bonding electrode 12 is rectangular and includes two opposite edges extending along the first direction X and two opposite edges extending along the second direction Y, so that the difficulty of setting the sizes of the bonding electrodes 12 is further reduced.

Figure 8:
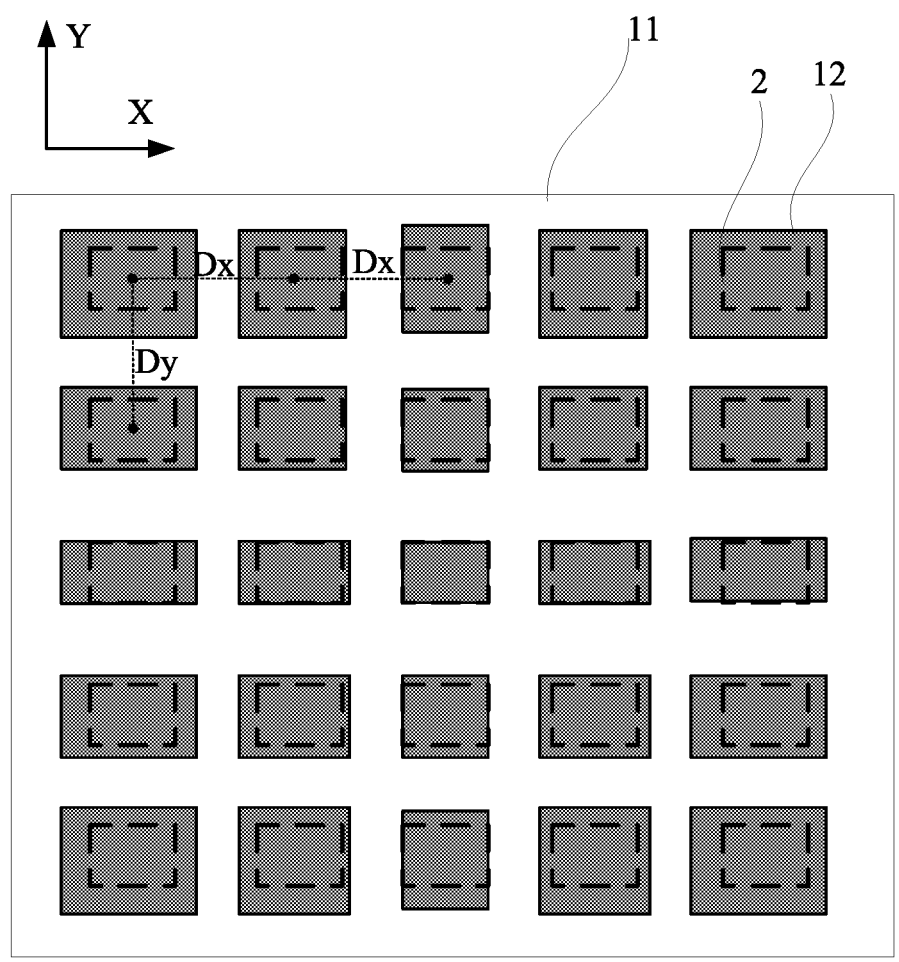
FIG. 8 is a plan structural view of another display panel according to an embodiment of the present disclosure.

Referring to FIG. 8, FIG. 8 is a plan structural view of another display panel according to an embodiment of the present disclosure. In an embodiment, a standard matrix structure including multiple standard bonding positions 2 may be defined on the plane where the base substrate 11 is located; all of the standard bonding positions 2 have a same size; distances between centers of adjacent two standard bonding positions 2 along the first direction X are equal; and distances between centers of adjacent two of the standard bonding positions 2 along the second direction Y are equal. The matrix structure includes bonding electrodes 12 in one-to-one correspondence to the standard bonding positions 2; and a vertical projection of each bonding electrode 12 on the base substrate 11 overlaps a corresponding standard bonding position 2.

When the bonding electrodes 12 are arranged in a matrix, the embodiment defines a standard matrix structure. The standard matrix structure includes multiple standard bonding positions 2. The standard bonding positions 2 are disposed in one-to-one correspondence to the bonding electrodes 12. The bonding positions 2 may be positions at which the Micro-LEDs are attached to the transfer substrate before being bonded. Along the first direction X, distances Dx between centers of adjacent two standard bonding positions 2 are the same, and along the second direction Y, distances Dy between centers of adjacent two standard bonding positions 2 are the same. In this embodiment, the bonding electrodes 12 may be set relatively large. For example, along the first direction X from the center of the base substrate 11 to the edge, the length of the sides of the bonding electrode 12 gradually increases, and along the second direction Y from the center of the base substrate 11 to the edge, the length of the sides of the bonding electrode 12 gradually increases, so that vertical projections of the bonding electrodes 12 on the base substrate 11 overlap the corresponding standard bonding positions 2. That is, the bonding electrodes 12 reserve offset spaces for the corresponding Micro-LEDs.

With continued reference to FIG. 3, in an embodiment, a standard matrix structure including multiple standard bonding positions 2 may be defined on the plane where the base substrate 11 is located; each of the standard bonding positions 2 has a same size; a distance between centers of adjacent two standard bonding positions 2 along the first direction is Dx; and a distance between centers of adjacent two standard bonding positions 2 along the second direction is Dy. The matrix structure includes bonding electrodes 12 in one-to-one correspondence to the standard bonding positions 2; each bonding electrode 12 includes a standard portion and a widened portion, and a vertical projection of the standard portion on the base substrate 11 overlaps a corresponding standard bonding position 2. Along the first direction X from the center O of the base substrate 11 to the edge of the base substrate 11, a size of a widened portion of an n-th bonding electrode 12 is Axn which satisfies: $Axn=k \times Dxn$, where k is a linear expansion coefficient of a transfer material for bonding the Micro-LEDs; and $Dxn=n \times Dx$; and along the second direction Y from the center O of the base substrate 11 to the edge of the base substrate 11, a size of a widened portion of the n-th bonding electrode is Ayn which satisfies: $Ayn=k \times Dyn$, where $Dyn=n \times Dy$.

Similarly, when the bonding electrodes 12 are arranged in a matrix, the embodiment defines a standard matrix structure. The standard matrix structure includes multiple standard bonding positions 2. The standard bonding positions 2 are disposed in one-to-one correspondence to the bonding electrodes 12. The bonding positions 2 may be positions at which the Micro-LEDs are attached to the transfer substrate before being bonded. Along the first direction X, distances Dx between centers of adjacent two standard bonding positions 2 are the same, and along the second direction Y, distances Dy between centers of adjacent two standard bonding positions 2 are the same. As shown in FIG. 3, in the embodiment, when it is ensured that along the first direction X from the center of the base substrate 11 to the edge, the size of the bonding electrode 12 along the first direction X gradually increases, and the size of the bonding electrode 12 along the second direction Y gradually increases. However, the size of the bonding electrode 12 in the embodiment increases directionally, that is, the bonding electrode 12 extends along the first direction X from the center of the base substrate 11 to the edge, and the bonding electrode 12 extends along the second direction Y from the center of the base substrate 11 to the edge, and that is, the extension direction of the bonding electrode 12 is same as the offset direction of the Micro-LED, so that the bonding area between the bonding electrode 12 and the corresponding Micro-LED is further increased.

Figure 9:
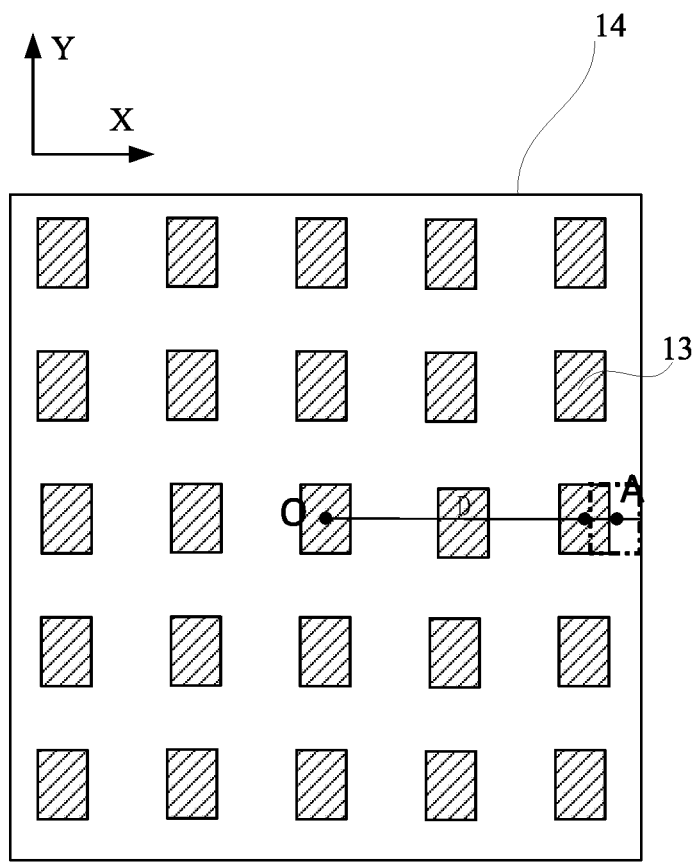
FIG. 9 is a schematic view of offsetting of Micro-LEDs provided by an embodiment of the present disclosure.

As shown in FIG. 9, FIG. 9 is a schematic view of offsetting of Micro-LEDs provided by an embodiment of the present disclosure. Multiple Micro-LEDs 13 are attached to the transfer material 14. When the eutectic bonding process is not performed, a distance from a center of the transfer material 14 to the Micro-LED 13 at each position is set to D on a plane where the transfer material 14 is located. Then, the offset amount A of the Micro-LED 13, the distance from which to the center of the transfer material 14 is D, after the eutectic bonding process satisfies a linear relationship: $A=k \times D$, where k is a linear expansion coefficient of the transfer material 14 when heated. In this embodiment, the offset amount and offset direction of the Micro-LED 13 are estimated based on this corresponding relationship.

In one embodiment, each bonding electrode 12 includes a standard portion 121 and a widened portion 122, and the vertical projection of the standard portion 121 on the base substrate 11 completely coincides with the vertical projection of the corresponding standard bonding position 2 on the base substrate 11. The widened portion 122 may compensate for the offset amount of the Micro-LED 13 to ensure the bonding of the bonding electrode 12 with the corresponding Micro-LED 13. Along the first direction X from the center O of the base substrate 11 to the edge of the base substrate 11, the size of the widened portion of an n-th bonding electrode 12 is Axn which satisfies: $Axn=k \times Dxn$, Dxn is the distance between the n-th bonding electrode 12 and the center of the base substrate 11, that is, $Dxn=n \times Dx$, so that the size of the widened portion of the n-th bonding electrode 12 is the offset amount of the n-th Micro-LED 13 along the first direction X from the center O of the base substrate 11 to the edge of the base substrate 11. For example, when n=1, the size of the widened portion of a first bonding electrode 12 Ax1 which satisfies: $Ax1=k \times Dx$; when n=2, the size of the widened portion of a second bonding electrode 12 is Ax2 which satisfies: $Ax2=k \times 2 \times Dx$. Similarly, the size of the widened portion of an n-th bonding electrode 12 is Ayn which satisfies: Ayn=k×Dyn, where Dyn=n×Dy. In the embodiment, the offset direction and the offset amount of the Micro-LED 13 in the bonding process are predicted, and the widened portion 122 is set according to the offset direction and the offset amount, so that the bonding area between the bonding electrode 12 and the corresponding Micro-LED is further increased, the bonding accuracy is improved, and the quality rate of the display panel is improved.

With continued reference to FIG. 3, in an embodiment, along the first direction X from the center O of the base substrate 11 to the edge of the base substrate 11, the distance between centers of adjacent two bonding electrodes 12 may gradually increase; and along the second direction Y from the center O of the base substrate 11 to the edge of the base substrate 11, the distance between centers of adjacent two bonding electrodes 12 gradually increases. Due to the design of the widened portion of the bonding electrode 12, the center of the bonding electrode 12 has an offset relative to the center of the standard bonding position 2. As shown in FIG. 3, along the first direction X from the center O of the base substrate 11 to the edge of the base substrate 11, the distance between centers of adjacent two bonding electrodes 12 may gradually increase; and along the second direction Y from the center O of the base substrate 11 to the edge of the base substrate 11, the distance between centers of adjacent two bonding electrodes 12 gradually increases. Therefore, the offset amount of the Micro-LED 13 during the bonding process is compensated for, the bonding quality is improved, and it is ensured that the Micro-LED 13 emits light normally in subsequent operating.

With continued reference to FIG. 7, along the direction from the center O of the base substrate 11 to the edge of the base substrate 11, the distance between centers of adjacent two bonding electrodes 12 may gradually increase. Multiple bonding electrodes 12 are disposed in rows along the first direction X and in columns along the second direction Y to form a matrix structure; and the first direction X intersects the second direction Y. Along the first direction X from the center O of the base substrate 11 to the edge of the base substrate 11, the distance between centers of adjacent two bonding electrodes 12 gradually increases; and along the second direction Y from the center O of the base substrate 11 to the edge of the base substrate 11, the distance between centers of adjacent two bonding electrodes 12 gradually increases.

In the embodiment, the size of the bonding electrode 12 may be not widened. Instead, based on the calculation of the offset amount of the Micro-LED 13, the bonding electrode 12 offsets by the same offset amount. When multiple bonding electrodes 12 form a matrix array, along the first direction X from the center O of the base substrate 11 to the edge of the base substrate 11, the distance between centers of adjacent two bonding electrodes 12 may gradually increase; similarly, along the second direction Y from the center O of the base substrate 11 to the edge of the base substrate 11, the distance between centers of adjacent two bonding electrodes 12 gradually increases, so that the center position of the Micro-LED 13 after offsetting during the bonding process exactly coincides with the center of the corresponding bonding electrode 12. In an embodiment, the size of the bonding electrode 12 in this embodiment is same as the size of the standard bonding position 2, and only the position is moved. Therefore, the embodiment does not increase the size of the bonding electrode 12 while improving the bonding quality of the bonding electrode 12 and the corresponding Micro-LED. Moreover, it is not necessary to occupy the gap between adjacent bonding electrodes 12 to widen the bonding electrodes 12, to prevent adjacent bonding electrodes 12 from being too close.

With continued reference to FIG. 7, in an embodiment, a standard matrix structure including multiple standard bonding positions 2 may be defined on the plane where the base substrate 11 is located; each the standard bonding positions 2 has a same size; a distance between centers of adjacent two standard bonding positions 2 along the first direction X is Dx; and a distance between centers of adjacent two standard bonding positions 2 along the second direction is Dy. The matrix structure includes bonding electrodes in one-to-one correspondence to the standard bonding positions 2; along the first direction X from the center O of the base substrate 11 to the edge of the base substrate 11, a center offset amount Bxn between an n-th bonding electrode 12 and an n-th standard bonding position 2 satisfies: Bxn=k×Dxn, where k is a linear expansion coefficient of a transfer material for bonding the Micro-LEDs, and Dxn=n×Dx; and along the second direction Y from the center O of the base substrate 11 to the edge of the base substrate 11, a center offset amount Byn between the n-th bonding electrode 12 and the n-th standard bonding position 2 satisfies: Byn=k×Dyn, where Dyn=n×Dy.

When the bonding electrodes 12 are arranged in a matrix, the embodiment defines a standard matrix structure. The standard matrix structure includes multiple standard bonding positions 2. The standard bonding positions 2 are disposed in one-to-one correspondence to the bonding electrodes 12. The bonding positions 2 may be positions at which the Micro-LEDs are attached to the transfer substrate before being bonded. Along the first direction X, distances Dx between centers of adjacent two standard bonding positions 2 are the same, and along the second direction Y, distances Dy between centers of adjacent two standard bonding positions 2 are the same. From FIG. 9, the offset amount of the Micro-LED at the standard bonding position 2 due to the transfer material may be estimated and calculated, and the center of the corresponding bonding electrode 12 may offset according to the above offset amount. In one embodiment, along the first direction X from the center O of the base substrate 11 to the edge of the base substrate 11, a offset amount between a center of an n-th bonding electrode 12 and a center of an n-th standard bonding position 2 is Bxn which satisfies: Bxn=k×Dxn, where Dxn is the distance between the n-th bonding electrode 12 and the center of the base substrate 11, that is, Dxn=n×Dx; and along the second direction Y from the center O of the base substrate 11 to the edge of the base substrate 11, a offset amount between a center of the n-th bonding electrode 12 and a center of the n-th standard bonding position 2 is Byn which satisfies: Byn=k×Dyn, that is, Dyn=n×Dy. In this embodiment, the offset direction and the offset amount of the Micro-LED in the bonding process are predicted, and the center of the bonding electrode 12 is set according to the offset direction and the offset amount, so that the center of the bonding electrode 12 is adapted to the center of the offsetting Micro-LED. In an embodiment, the center of the bonding electrode 12 and the center of the offsetting Micro-LED may completely coincide with each other. Therefore, the bonding area between the bonding electrode 12 and the corresponding Micro-LED is further increased, the bonding accuracy is improved, and the quality rate of the display panel is improved.

In an embodiment, along the first direction X from the center O of the base substrate 11 to the edge of the base substrate 11, the size of the bonding electrode 12 may gradually increase. In the embodiment, on the premise of ensuring that along the direction from the center O of the base substrate 11 to the edge of the base substrate 11, the distance between centers of adjacent two bonding electrodes 12 gradually increases, and along the first direction X from the center O of the base substrate 11 to the edge of the base substrate 11, the distance between centers of adjacent two bonding electrodes 12 gradually increases, the size of each bonding electrode 12 may appropriately increase, to prevent the situation that some Micro-LEDs do not offset according to a preset track in the bonding process. Even if the Micro-LEDs offset to other directions, the appropriately increased part of the sizes of the bonding electrodes 12 may compensate for the offsetting situation of the Micro-LEDs, so that the bonding of the bonding electrodes 12 and the corresponding Micro-LEDs is ensured, and the bonding quality is improved.

In an embodiment, each bonding electrode 12 may include a positive electrode and a negative electrode; the positive electrode of each bonding electrode 12 and the negative electrode of each bonding electrode 12 are sequentially arranged along the first direction X; along the first direction X, a size of the positive electrode is L1, a size of the negative electrode is L2, and a size of a gap between the positive electrode and the negative electrode is U. Each bonding electrode 12 includes a standard portion and a widened portion; an area of a vertical projection of the standard portion on the base substrate 11 is same as an area of a respective standard bonding position 2; and along the first direction X from the center O of the base substrate 11 to the edge of the base substrate 11, a size of the widened portion of each bonding electrode is En which satisfies:

$$En = \left(\frac{L1 + L2}{2} + U\right) * k.$$

Figure 10:
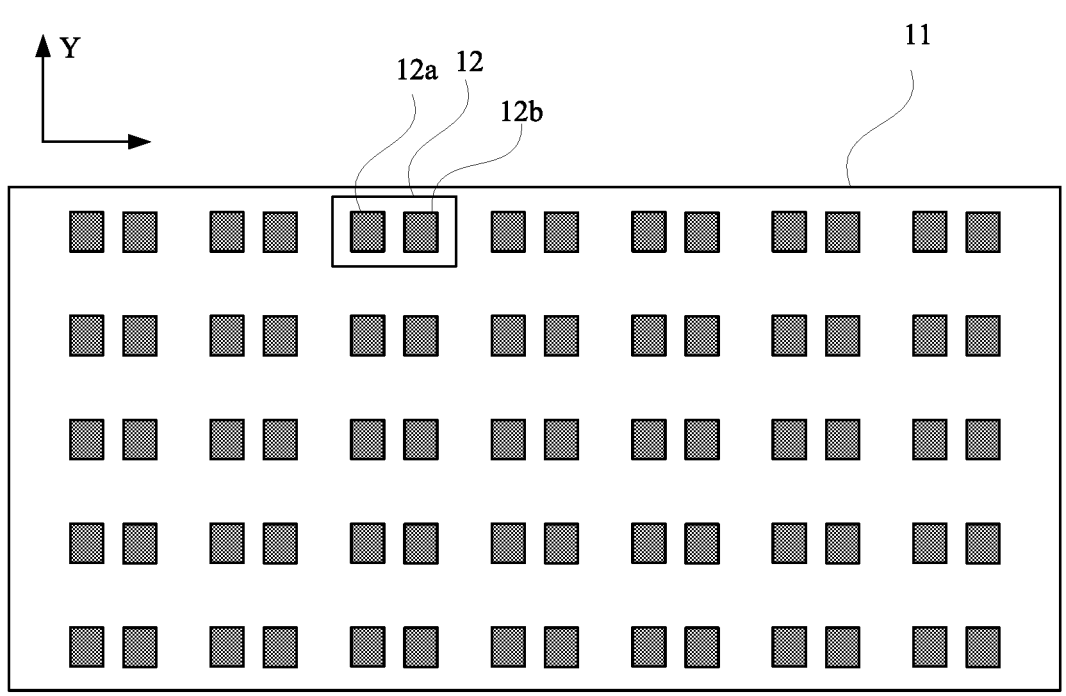
FIG. 10 is a plan structural view of another display panel according to an embodiment of the present disclosure.
Figure 11:
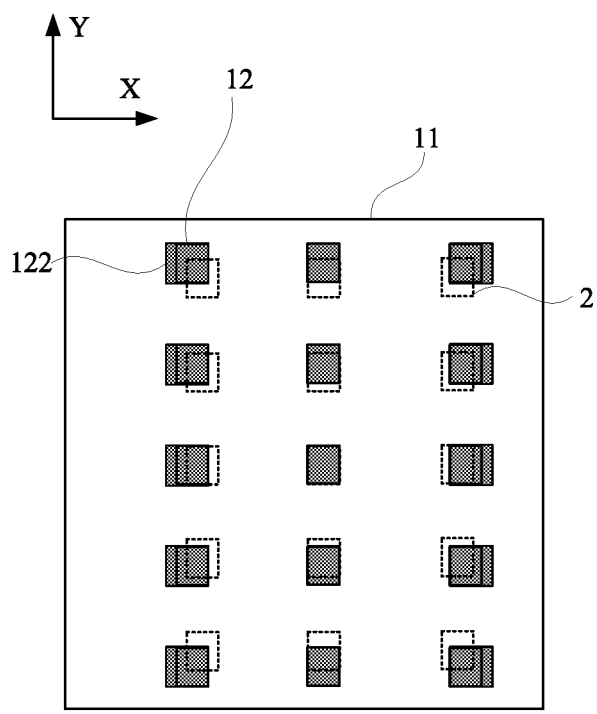
FIG. 11 is a plan structural view of another display panel according to an embodiment of the present disclosure.
Figure 12:
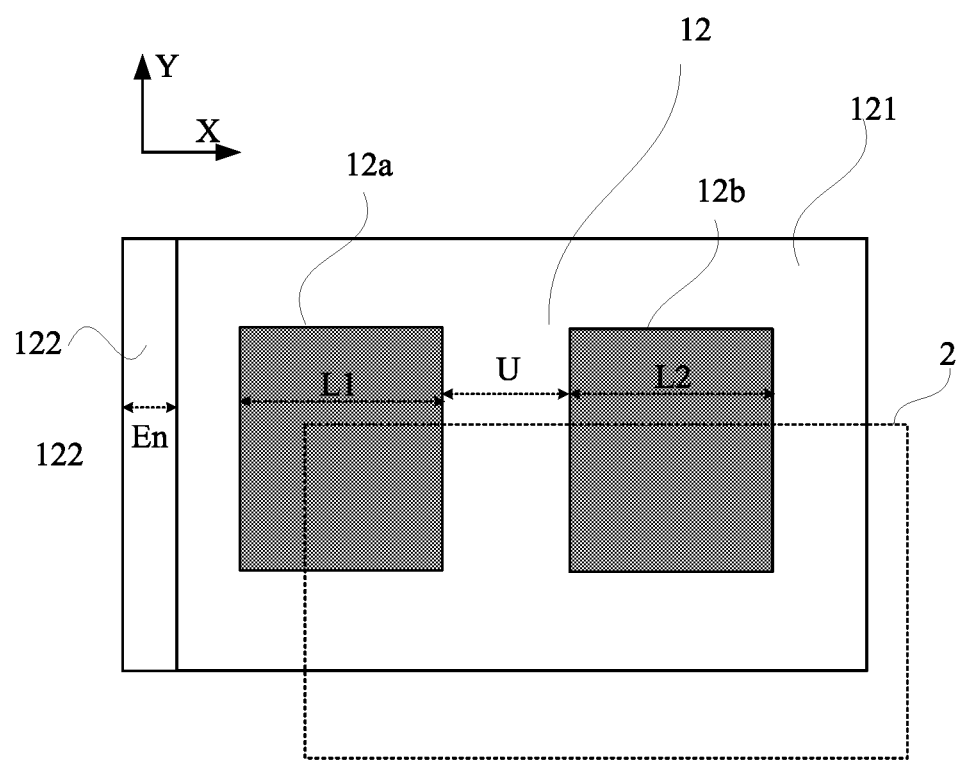
FIG. 12 is an enlarged structural view of a bonding electrode in FIG. 11.

As shown in FIG. 10, FIG. 10 is a plan structural view of another display panel according to an embodiment of the present disclosure. Actually, each bonding electrode 12 includes two parts: a positive electrode 12a and a negative electrode 12b. Similarly, each Micro-LED includes two electrodes respectively corresponding to the above positive electrode 12a and negative electrode 12b, so that an error may exist if the offset amount is determined according to the center of the Micro-LED. In this embodiment, a widened portion is set for each bonding electrode 12 on the basis that the center of the bonding electrode 12 is set to coincide with the center of the offsetting Micro-LED. In one embodiment, as shown in FIG. 10, the positive electrode 12a of each bonding electrode 12 and the negative electrode of each bonding electrode 12 are sequentially arranged along the first direction X, so that each bonding electrode 12 may only be provided with a widened portion 122 along the first direction X. In one embodiment, as shown in FIG. 11 and FIG. 12, FIG. 11 is a plan structural view of another display panel according to an embodiment of the present disclosure, and FIG. 12 is an enlarged structural view of a bonding electrode in FIG. 11. As shown in FIG. 12, in the embodiment, the size of the positive electrode is L1, the size of the negative electrode is L2, and the size of the gap between the positive electrode and the negative electrode is U. Each bonding electrode 12 includes a standard portion 121 and a widened portion 122; the area of the vertical projection of the standard portion on the base substrate 11 is same as the area of a respective standard bonding position 2; and along the first direction X from the center O of the base substrate 11 to the edge of the base substrate 11, the size of the widened portion of each bonding electrode is En which satisfies:

$$En = \left(\frac{L1 + L2}{2} + U\right) * k.$$

The widened portion 122 may compensate for the setting error of the positive electrode 12a and the negative electrode 12b during the offset process of the Micro-LED, so that the bonding quality of the positive electrode 12a and one electrode of the corresponding Micro-LED is ensured, and the bonding quality of the negative electrode 12b and the other electrode of the corresponding Micro-LED is ensured.

Figure 13:
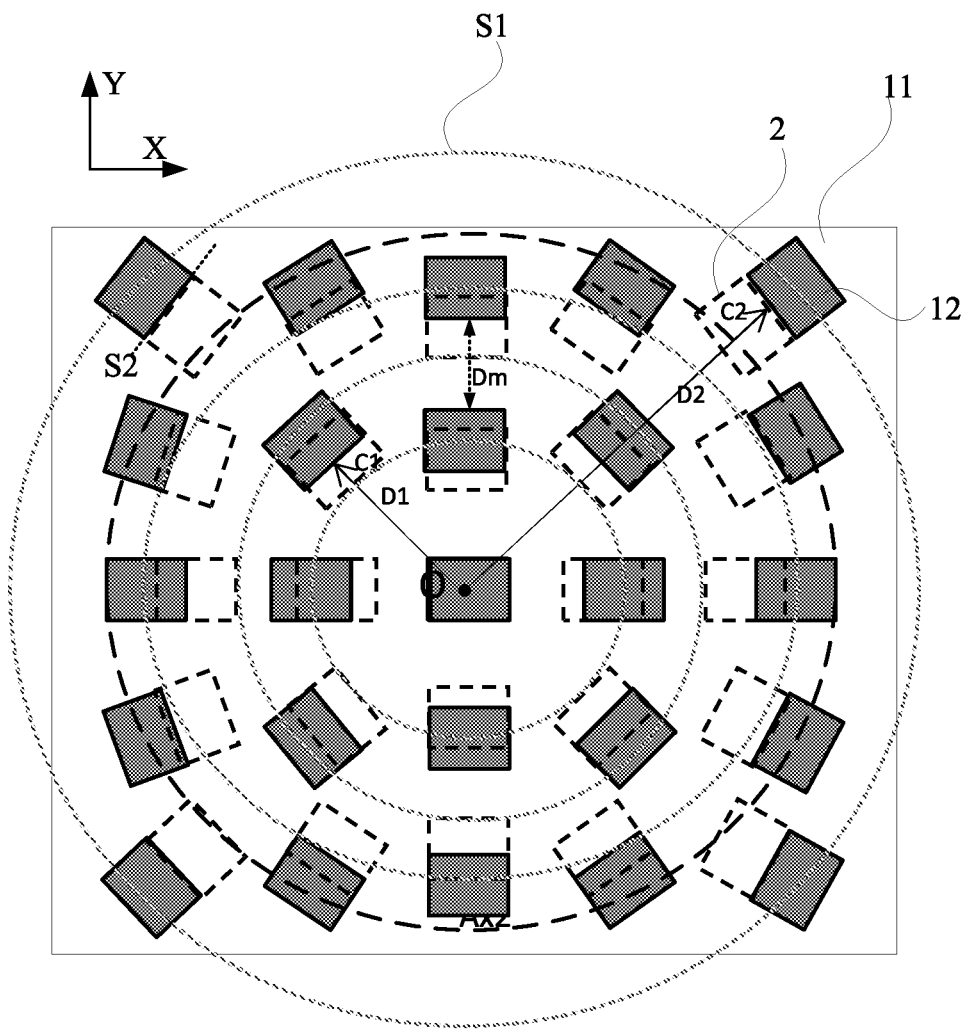
FIG. 13 is a plan structural view of another display panel according to an embodiment of the present disclosure.

FIG. 13 is a plan structural view of another display panel according to an embodiment of the present disclosure. In an embodiment, along the direction from the center O of the base substrate 11 to the edge of the base substrate 11, the distance between centers of adjacent two bonding electrodes 12 gradually increases. Centers of multiple bonding electrodes 12 are arranged around the center O of the base substrate 11 to form an annular structure S; and along a direction from the center O of the base substrate 11 to the edge of the base substrate 11, the base substrate 11 includes multiple annular structures S with coincident centers; and along a direction from the center O of the base substrate 11 to the annular structure S, a distance between centers of adjacent two bonding electrodes 12 gradually increases.

As shown in FIG. 13, the bonding electrodes 12 in the embodiment may be arranged in an annular structure. In one embodiment, centers of multiple bonding electrodes 12 are arranged around the center O of the base substrate 11 to form an annular structure S1; and along the direction from the center O of the base substrate 11 to the edge of the base substrate 11, multiple annular structures S1 may be sequentially disposed on the base substrate 11, and centers of the multiple annular structures S1 may coincide with each other. Along the direction from the center O to the annular structure S1, that is, along the direction perpendicular to a tangent line of the annular structure S1, the distance between centers of adjacent two bonding electrodes 12 gradually increases, so that the bonding electrodes 12 are adapted to the offsetting Micro-LEDs. In this way, it is ensured that the bonding electrodes 12 are bonded with the corresponding Micro-LEDs, and the manufacturing quality of the display panel is improved. In this embodiment, the bonding electrodes 12 on the base substrate 11 are arranged in the manner of a ring around a center point, which is conductive to calculating the compensation for the offset amount of the bonding electrodes 12 and improving the compensation accuracy.

With continued reference to FIG. 13, in an embodiment, each bonding electrode 12 includes a linear first edge S2; and the linear first edge S2 is disposed parallel to a tangent line of an annular structure S1 where the bonding electrode 12 is located. As shown in FIG. 13, the bonding electrode 12 includes a linear first edge S2, which is conductive to calculating the offset amount of the bonding electrode 12. For example, the first edge S2 may be used as a standard for calculating the offset amount of the bonding electrode, instead of using the center of the bonding electrode 12 as the standard for calculating the offset amount of the bonding electrode 12. For example, the first edge S2 may be disposed tangentially to the annular structure S1, which is conductive to setting the bonding electrode 12 and improving the compensation accuracy of the offset amount of the bonding electrode 12.

With continued reference to FIG. 13, in an embodiment, multiple standard annular structures may be defined on the plane where the base substrate 11 is located; each standard annular structure includes multiple standard bonding positions 2; each of the standard bonding positions 2 has a same size; and along the direction from the center O of the base substrate 11 to the annular structure, a distance between centers of adjacent two standard bonding positions 2 is Dm. Each annular structure includes multiple bonding electrodes 12 in one-to-one correspondence to the multiple standard bonding positions 2; along the direction from the center O of the base substrate 11 to the annular structure, a offset amount between a center of an n-th bonding electrode 12 and a center of an n-th standard bonding position 2 is Cmn which satisfies: Cmn=k×Dmn, where k is a linear expansion coefficient of a transfer material for bonding the Micro-LEDs, and Dmn=n×Dm.

When the bonding electrodes 12 are arranged in an annular structure, the embodiment defines a standard annular structure. The standard annular structure includes multiple standard bonding positions 2. The standard bonding positions 2 are disposed in one-to-one correspondence to the bonding electrodes 12. The bonding positions 2 may be positions at which the Micro-LEDs are attached to the transfer substrate before being bonded. Along the direction from the center O of the base substrate 11 to the annular structure, the distance between centers of adjacent two standard bonding positions 2 is Dm. Along the direction from the center O of the base substrate 11 to the annular structure, the offset amount between a center of an n-th bonding electrode 12 and a center of an n-th standard bonding position 2 is Cmn which satisfies: Cmn=k×Dmn, where Dmn is a distance between the center of the n-th bonding electrode 12 and the center O of the base substrate 11, that is, Dmn=n×Dm. In the embodiment, the offset direction and the offset amount of the Micro-LED in the bonding process are predicted, and the center of the bonding electrode 12 is set according to the offset direction and the offset amount, so that the center of the bonding electrode 12 is adapted to the center of the offsetting Micro-LED. In an embodiment, the center of the bonding electrode 12 and the center of the offsetting Micro-LED may completely coincide with each other. Therefore, the bonding area between the bonding electrode 12 and the corresponding Micro-LED is further increased, the bonding accuracy is improved, and the quality rate of the display panel is improved. In addition, the setting of the annular structure further facilitates the calculation of the offset amount and improves the layout effect of the bonding electrodes 12.

In an embodiment, along the direction from the center O of the base substrate 11 to the edge of the base substrate 11, the distance between centers of adjacent two bonding electrodes 12 may gradually increase; and along the direction from the center O of the base substrate 11 to the edge of the base substrate 11, distances between centers of adjacent two bonding electrodes 12 are in an arithmetic progression, or distances between centers of adjacent bonding electrodes 12 are in a higher order arithmetic progression.

The expansion coefficient of the Micro-LEDs expanding following the transfer material is a linear expansion coefficient. Therefore, along the direction from the center O of the base substrate 11 to the edge of the base substrate 11, distances between centers of adjacent two bonding electrodes 12 may be in an arithmetic progression, which conforms to the expansion law of the transfer material. In the embodiment, the bonding electrodes 12 are disposed in a staggered manner according to the expansion law of the transfer material, to facilitate the matching of the bonding electrodes 12 with the corresponding bonded Micro-LEDs and ensure the normal lighting of the Micro-LEDs.

In addition, since the space of the gap between two adjacent bonding electrodes 12 is limited, when the array of the bonding electrodes 12 is relatively large, it may be set in the embodiment that along the direction from the center O of the base substrate 11 to the edge of the base substrate 11, distances between centers of adjacent bonding electrodes 12 are in an arithmetic progression of higher order, so that the distances between adjacent two bonding electrodes 12 are prevented from being relatively small on the premise that the bonding electrodes 12 are matched with the positions of the corresponding bonded Micro-LEDs.

Figure 14:
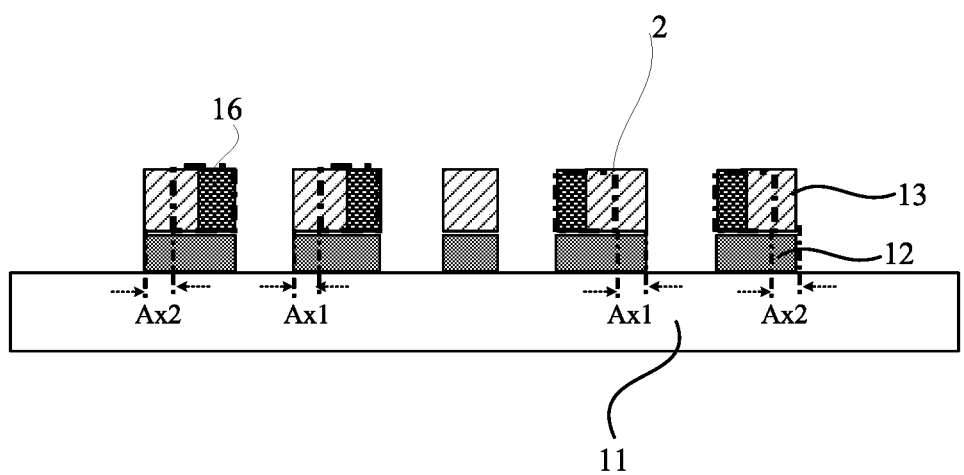
FIG. 14 is another sectional structural view of the display panel in FIG. 3 taken along a segment b1-b1'.

FIG. 14 is another sectional structural view of the display panel in FIG. 3 taken along a segment b1-b1'. In an embodiment, a side wall of each Micro-LED may be provided with a light-absorbing material 16; and the light-absorbing material 16 may be a linear thermal expansion material.

In the transferring process of the Micro-LEDs 13 through the transfer substrate, the transfer substrate is attached to the Micro-LEDs 13 through the transfer material. As shown in FIG. 14, the side wall of each Micro-LED may be provided with a light-absorbing material 16; and the light-absorbing material 16 is a linear thermal expansion material that may follow the Micro-LEDs 13 to be transferred by the transfer substrate. In the embodiment, the size of the bonding electrode 12 is larger than the size of the Micro-LED 13. As a result, after the bonding electrode 12 is bonded with the Micro-LED 13, part of the bonding electrode 12 is exposed, which easily reflects the light emitted by the Micro-LED 13 and thus affects the luminous effect of the display panel. In the embodiment, the light-absorbing material is set on the side wall of the Micro-LED 13. After the eutectic bonding process is completed, the light-absorbing material 16 expands, so that the range of the bonding electrode 12 larger than the Micro-LED 13 is shielded, the reflected light is absorbed, and the display quality of the panel is improved. Moreover, the light-absorbing material 16 expands with the expansion of the transfer material, so that it is avoided that the bonding cannot be achieved due to the Micro-LEDs 13 falling off prematurely during the expansion process of the transfer material, and the bonding quality of the bonding electrodes 12 and the corresponding Micro-LEDs is improved.

In an embodiment, along the direction from the center O of the base substrate 11 to the edge of the base substrate 11, a thickness of the light-absorbing material 16 disposed on the side wall of each Micro-LED may gradually increase. The closer to the edge of the transfer substrate the transfer material is, the greater the expansion of the transfer material is, and correspondingly, the greater the offset amount of the Micro-LED 13 is. Therefore, along the direction from the center O of the base substrate 11 to the edge of the base substrate 11, the size of the bonding electrode 12 gradually increases, and the part of the bonding electrode 12 larger than the Micro-LED 13 gradually increases, so that the light-absorbing material 16 is set to be thicker. The light-absorbing material 16 has a larger volume after expansion, so that the bonding electrode 12 is shielded and thus is prevented from reflecting light, and the display quality is improved.

In an embodiment, the linear thermal expansion coefficient of the light-absorbing material 16 may be same as a linear expansion coefficient of the transfer material for bonding the Micro-LEDs. Then the light-absorbing material 16 and the transfer material for bonding the Micro-LED simultaneously generate linear expansion, to avoid relative movement between the Micro-LED and the transfer material, preventing the Micro-LED from falling off due to the relative movement with the transfer material, and improving the bonding quality of the bonding electrode 12 and the corresponding Micro-LED.

In an embodiment, the light-absorbing material 16 may be at least one of a foamed plastic or a photodeformable polymeric material. For example, the light-absorbing material 16 may include a polymeric material including triphenylmethane derivative. The foamed plastic or the photodeformable polymeric material may be an expandable light-shielding material. When the light-absorbing material 16 is formed by such an expandable light-shielding material, the light-absorbing material 16 may expand at a high temperature, or react with other gases, or under conditions such as UV light, so that the bonding electrode 12 is shielded by the increased volume of the light-absorbing material 16, and the display effect of the panel is improved.

An embodiment of the present disclosure further provides a display device. FIG. 15 is a structural view of a display device according to an embodiment of the present disclosure. As shown in FIG. 15, the display device provided by the embodiment of the present disclosure includes the display panel 1 provided by any one of the embodiments of the present disclosure. The display device may be a mobile phone shown in FIG. 15, or may be a computer, a television, a smart wearable device, or the like, and is not In one embodiment limited in the embodiment.

Based on the same concept, an embodiment of the present disclosure further provides a manufacturing method of a display panel. FIG. 16 is a flowchart of a manufacturing method of a display panel according to an embodiment of the present disclosure. As shown in FIG. 16, the method includes the steps described below.

In step S110, a base substrate is obtained, where multiple bonding electrodes are disposed on the base substrate; and on a plane parallel to a plane where the base substrate is located and along a direction from a center of the base substrate to an edge of the base substrate, a size of each bonding electrode gradually increases, or a distance between centers of adjacent two bonding electrodes gradually increases.

In step S120, multiple Micro-LEDs disposed in an array on a transfer substrate is obtained, where the Micro-LEDs and the transfer substrate are attached through a transfer material; the transfer material is a thermal expandable material; the Micro-LEDs form a chip array on the transfer substrate; each Micro-LED has a same size; and distances between adjacent Micro-LEDs are the same.

In the embodiment, when the multiple Micro-LED disposed in an array on the transfer substrate are not subjected to the eutectic bonding process, the position of each Micro-LED is the standard bonding position.

In step S130, each Micro-LED is bonded with a bonding electrode corresponding to the Micro-LED, so that after offsetting due to the transfer material, the Micro-LED is g bonded with the bonding electrode corresponding to the Micro-LED.

In the embodiment of the present disclosure, the base substrate of the display panel is provided with multiple bonding electrodes. On the plane where the base substrate is located, along the direction from the center of the base substrate to the edge of the base substrate, the size of each bonding electrode gradually increases, or along the direction from the center of the base substrate to the edge of the base substrate, the distance between centers of adjacent two bonding electrodes gradually increases, or along the direction from the center of the base substrate to the edge of the base substrate, the size of each bonding electrode gradually increases and the distance between centers of adjacent two bonding electrodes gradually increases. Multiple Micro-LEDs are disposed on the side of multiple bonding electrodes facing away from the base substrate. The Micro-LEDs are bonded with corresponding bonding electrodes through the transfer substrate coated with a transfer material, so that after offsetting due to the transfer material, positions of the Micro-LEDs can be bonded with the corresponding bonding electrodes. In this embodiment, the trend of the offset of the Micro-LEDs due to the transfer material is predicted, the positions of the bonding electrodes are disposed at the offset positions of the Micro-LEDs or the sizes of the Micro-LEDs are enlarged, so that the Micro-LEDs can be bonded with the corresponding bonding electrodes.

In one example of the embodiment, on the plane parallel to the plane where the base substrate is located and along the direction from the center of the base substrate to the edge of the base substrate, the distance between centers of adjacent two bonding electrodes gradually increases. FIG. 17 is a flowchart of another manufacturing method of a display panel according to an embodiment of the present disclosure. As shown in FIG. 17, the method of the embodiment includes the steps described below.

In step S210, a standard array structure including multiple standard bonding positions is defined on the plane where the base substrate is located; where the multiple standard bonding positions and the multiple Micro-LEDs of the chip array are in one-to-one correspondence and the multiple standard bonding positions have a same size; and a distance between centers of adjacent two standard bonding positions is same as a distance between adjacent Micro-LEDs.

In step S220, simulated stretch is performed to the standard array structure according to an expansion coefficient of the transfer material to obtain a target array structure; where in the target array structure, along the direction from the center of the base substrate to the edge of the base substrate, a distance between centers of adjacent two bonding positions gradually increases.

In step S230, one-to-one corresponding bonding electrodes are disposed on the base substrate according to the multiple bonding positions in the target array structure.

In step S240, multiple Micro-LEDs disposed in an array on a transfer substrate is obtained.

In step S250, each Micro-LED is bonded with a corresponding bonding electrode, so that after offsetting due to the transfer material, the Micro-LED is bonded with the corresponding bonding electrode.

In the embodiment, before the bonding electrodes are formed, a standard array structure including multiple standard bonding positions is defined. The standard array structure is a chip array before the Micro-LEDs expand following the transfer material, then simulated stretch is performed to the standard array structure according to an expansion coefficient of the transfer material to obtain a target array structure, and the target array is a chip array after the Micro-LEDs generate the offset amount following the transferred material.

In another example of the embodiment, the step that multiple bonding electrodes are disposed on the base substrate includes the steps described below. A seed layer is formed on the base substrate; and the multiple bonding electrodes are formed on the seed layer through an electroplating process; where on the plane parallel to the plane where the base substrate is located and along the direction from the center of the base substrate to the edge of the base substrate, the size of each bonding electrode gradually increases. In the embodiment, the electroplating process may be used to electroplate multiple bonding electrodes on the seed layer. It should be noted that the electroplating current is injected from the edge of the seed layer. If the size of each bonding electrode is the same, during the electroplating process, the bonding electrodes close to the edge should be thicker than the bonding electrodes close to the center. In the embodiment, an array of electroplating holes is set, so that along the direction from the center of the base substrate to the edge of the base substrate, the size of the bonding electrode gradually increases, and thus the thickness of the bonding electrode close to the edge can be effectively reduced. Therefore, the size of the bonding electrode sequentially increases along the direction from the center of base substrate to the edge of the base substrate, so that the bonding electrode is matched with the offsetting Micro-LED; at the same time, it is convenient to achieve the uniformity of the thickness of the bonding electrodes on the entire display panel, to achieve the uniformity of the light emission of the display panel.

What is claimed is:

1. A display panel, comprising:
a base substrate;
wherein the base substrate is provided with a plurality of bonding electrodes; and
a plurality of micro light emitting displays (Micro-LEDs) are disposed on a side of the plurality of bonding electrodes facing away from the base substrate; and the plurality of Micro-LEDs are electrically connected to the plurality of bonding electrodes in one-to-one correspondence; and on a plane parallel to a plane where the base substrate is located, along a direction from a center of the base substrate to an edge of the base substrate, a size of each bonding electrode of the plurality of bonding electrodes gradually increases and/or a distance between centers of adjacent two of the plurality of bonding electrodes gradually increases to enable each Micro-LED of the plurality of Micro-LEDs to be bonded with a corresponding bonding electrode.

2. The display panel according to claim 1, wherein along the direction from the center of the base substrate to the edge of the base substrate, the size of the each bonding electrode gradually increases;
the plurality of bonding electrodes are arranged to form a matrix structure with rows along a first direction and columns along a second direction, and the first direction intersects the second direction;
along the first direction from the center of the base substrate to the edge of the base substrate, the size of the each bonding electrode gradually increases along the first direction; and
along the second direction from the center of the base substrate to the edge of the base substrate, the size of the each bonding electrode gradually increases along the second direction.

3. The display panel according to claim 2, wherein a standard matrix structure comprising a plurality of standard bonding positions is defined on the plane where the base substrate is located; all of the plurality of standard bonding positions have a same size;
distances between centers of adjacent two of the plurality of standard bonding positions along the first direction are equal; and
distances between centers of adjacent two of the plurality of standard bonding positions along the second direction are equal; and
the matrix structure comprises bonding electrodes in one-to-one correspondence to the plurality of standard bonding positions; and a vertical projection of each of the plurality of bonding electrodes on the base substrate overlaps with a corresponding standard bonding position.

4. The display panel according to claim 2, wherein a standard matrix structure comprising a plurality of standard bonding positions is defined on the plane where the base substrate is located; each of the plurality of standard bonding positions has a same size; a distance between centers of adjacent two of the plurality of standard bonding positions along the first direction is Dx; and a distance between centers of adjacent two of the plurality of standard bonding positions along the second direction is Dy;
the matrix structure comprises the plurality of bonding electrodes in one-to-one correspondence to the plurality of standard bonding positions; each of the plurality of bonding electrodes comprises a standard portion and a widened portion, and a vertical projection of the standard portion on the base substrate overlaps with a corresponding standard bonding position;
along the first direction from the center of the base substrate to the edge of the base substrate, a size of a widened portion of an n-th bonding electrode is Axn satisfying: Axn=k×Dxn, wherein k is a linear expansion coefficient of a transfer material for bonding the plurality of Micro-LEDs; and Dxn=n×Dx; and
along the second direction from the center of the base substrate to the edge of the base substrate, a size of a widened portion of the n-th bonding electrode is Ayn satisfying: Ayn=k×Dyn, wherein Dyn=n×Dy.

5. The display panel according to claim 4, wherein along the first direction from the center of the base substrate to the edge of the base substrate, a distance between centers of adjacent two of at least part of the plurality of bonding electrodes gradually increases; and
along the second direction from the center of the base substrate to the edge of the base substrate, a distance between centers of adjacent two of the at least part of the plurality of bonding electrodes gradually increases.

6. The display panel according to claim 1, wherein along the direction from the center of the base substrate to the edge of the base substrate, the distance between the centers of the adjacent two of the plurality of bonding electrodes gradually increases;
the plurality of bonding electrodes are disposed in rows along a first direction and in columns along a second direction to form a matrix structure; and the first direction intersects the second direction;
along the first direction from the center of the base substrate to the edge of the base substrate, a distance between centers of adjacent two of the plurality of bonding electrodes gradually increases; and
along the second direction from the center of the base substrate to the edge of the base substrate, a distance between centers of adjacent two of the plurality of bonding electrodes gradually increases.

7. The display panel according to claim 6, wherein a standard matrix structure comprising a plurality of standard bonding positions is defined on the plane where the base substrate is located; each of the plurality of standard bonding positions has a same size; a distance between centers of adjacent two of the plurality of standard bonding positions along the first direction is Dx; and a distance between centers of adjacent two of the plurality of standard bonding positions along the second direction is Dy;

the matrix structure comprises the plurality of bonding electrodes in one-to-one correspondence to the plurality of standard bonding positions; along the first direction from the center of the base substrate to the edge of the base substrate, a center offset amount between an n-th bonding electrode and an n-th standard bonding position is Bxn satisfying: Bxn=k×Dxn, wherein k is a linear expansion coefficient of a transfer material for bonding the plurality of Micro-LEDs, and Dxn=n×Dx; and along the second direction from the center of the base substrate to the edge of the base substrate, a center offset amount between the n-th bonding electrode and the n-th standard bonding position is Byn satisfying: Byn=k×Dyn, wherein Dyn=n×Dy.

8. The display panel according to claim 7, wherein along the first direction from the center of the base substrate to the edge of the base substrate, a size of each of the plurality of bonding electrodes gradually increases.

9. The display panel according to claim 8, wherein each of the plurality of bonding electrodes comprises a positive electrode and a negative electrode; the positive electrode of the each of the plurality of bonding electrodes and the negative electrode of the each of the plurality of bonding electrodes are sequentially arranged along the first direction; along the first direction, a size of the positive electrode is L1, a size of the negative electrode is L2, and a size of a gap between the positive electrode and the negative electrode is U; and each of the plurality of bonding electrodes comprises a standard portion and a widened portion; an area of a vertical projection of the standard portion on the base substrate is same as an area of a corresponding standard bonding position; and along the first direction from the center of the base substrate to the edge of the base substrate, a size of the widened portion of each of the plurality of bonding electrodes is En satisfying:

$$En = \left(\frac{L1 + L2}{2} + U\right) * k.$$

10. The display panel according to claim 1, wherein along the direction from the center of the base substrate to the edge of the base substrate, the distance between the centers of the adjacent two of the plurality of bonding electrodes gradually increases;

centers of the plurality of bonding electrodes are arranged around the center of the base substrate to form an annular structure; and along a direction from the center of the base substrate to the edge of the base substrate, the base substrate comprises a plurality of annular structures with coincident centers; and along a direction from the center of the base substrate to the annular structure, a distance between centers of adjacent two of at least part of the plurality of bonding electrodes gradually increases.

11. The display panel according to claim 10, wherein each of the plurality of bonding electrodes comprises a first edge being linear; and the first edge is disposed parallel to a tangent line of an annular structure where the bonding electrode comprising the first edge is located.

12. The display panel according to claim 10, wherein a plurality of standard annular structures are defined on the plane where the base substrate is located; each of the plurality of standard annular structures comprises a plurality of standard bonding positions; each of the plurality of standard bonding positions has a same size; and along the direction from the center of the base substrate to the annular structure, a distance between centers of adjacent two of the plurality of standard bonding positions is Dm; and each of the annular structure comprises bonding electrodes in one-to-one correspondence to the plurality of standard bonding positions; along the direction from the center of the base substrate to the annular structure, an offset from a center of an n-th bonding electrode to a center of an n-th standard bonding position is Cmn satisfying: Cmn=k×Dmn, wherein k is a linear expansion coefficient of a transfer material for bonding the plurality of Micro-LEDs, and Dxn=n×Dm.

13. The display panel according to claim 1, wherein along the direction from the center of the base substrate to the edge of the base substrate, the distance between the centers of the adjacent two of the plurality of bonding electrodes gradually increases; and along the direction from the center of the base substrate to the edge of the base substrate, distances between centers of adjacent two of the plurality of bonding electrodes are in an arithmetic progression, or distances between centers of adjacent two of the plurality of bonding electrodes are in a higher-order arithmetic progression.

14. The display panel according to claim 1, wherein a side wall of each of the plurality of Micro-LEDs is provided with a light-absorbing material; and the light-absorbing material is a linear thermal expansion material.

15. The display panel according to claim 14, wherein along the direction from the center of the base substrate to the edge of the base substrate, a thickness of the light-absorbing material disposed on the side wall of the each of the plurality of Micro-LEDs gradually increases.

16. The display panel according to claim 14, wherein a linear thermal expansion coefficient of the light-absorbing material is same as a linear expansion coefficient of a transfer material for bonding the plurality of Micro-LEDs.

17. A display device, comprising a display panel, wherein the display panel comprises: a base substrate;

wherein the base substrate is provided with a plurality of bonding electrodes; a plurality of micro light emitting displays (Micro-LEDs) are disposed on a side of the plurality of bonding electrodes facing away from the base substrate; and the plurality of Micro-LEDs are electrically connected to the plurality of bonding electrodes in one-to-one correspondence; and on a plane parallel to a plane where the base substrate is located, along a direction from a center of the base substrate to an edge of the base substrate, a size of each bonding electrode of the plurality of bonding electrodes gradually increases and/or a distance between centers of adjacent two of the plurality of bonding electrodes gradually increases to enable each Micro-LED of the plurality of Micro-LEDs to be bonded with a corresponding bonding electrode.

18. A manufacturing method of a display panel, comprising:

obtaining a base substrate, wherein a plurality of bonding electrodes are disposed on the base substrate; and on a plane parallel to a plane where the base substrate is located and along a direction from a center of the base substrate to an edge of the base substrate, a size of each of the plurality of bonding electrodes gradually increases, or a distance between centers of adjacent two of the plurality of bonding electrodes gradually increases;

obtaining a plurality of micro light emitting displays (Micro-LEDs) disposed in an array on a transfer substrate, wherein the plurality of Micro-LEDs and the transfer substrate are attached through a transfer material; the transfer material is a thermal expandable material; the plurality of Micro-LEDs form a chip array on the transfer substrate; each of the plurality of Micro-LED has a same size; and distances between adjacent Micro-LEDs are the same; and bonding each of the plurality of Micro-LEDs with a corresponding bonding electrode, so that after each of the plurality of Micro-LEDs is offset due to the transfer material, each of the plurality of Micro-LEDs are bonded with the corresponding bonding electrode.

19. The manufacturing method of a display panel according to claim 18, wherein on the plane parallel to the plane where the base substrate is located and along the direction from the center of the base substrate to the edge of the base substrate, the distance between the centers of the adjacent two of the plurality of bonding electrodes gradually increases; and the manufacturing method of a display panel further comprises:

defining a standard array structure comprising a plurality of standard bonding positions on the plane where the base substrate is located; wherein the plurality of standard bonding positions and the plurality of Micro-LEDs of the chip array are in one-to-one correspondence and each of the plurality of standard bonding positions has a same size; and a distance between centers of adjacent two of the plurality of standard bonding positions is same as a distance between adjacent Micro-LEDs; and performing simulated stretch to the standard array structure according to an expansion coefficient of the transfer material to obtain a target array structure; wherein in the target array structure, along the direction from the center of the base substrate to the edge of the base substrate, a distance between centers of adjacent two of the plurality of bonding positions gradually increases; and obtaining the base substrate comprises: disposing the plurality of the bonding electrodes on the base substrate in one-to-one correspondence to the plurality of bonding positions in the target array structure.

20. The manufacturing method of a display panel according to claim 18, wherein disposing the plurality of bonding electrodes on the base substrate comprises:

forming a seed layer on the base substrate; and forming the plurality of bonding electrodes on the seed layer through an electroplating process; wherein on the plane parallel to the plane where the base substrate is located and along the direction from the center of the base substrate to the edge of the base substrate, the size of the each of the plurality of bonding electrodes gradually increases.

* * * * *